United States Patent [19]

Cowher et al.

[11] 4,211,803
[45] Jul. 8, 1980

[54] CVD GROWTH OF MAGNETIC OXIDE FILMS HAVING GROWTH INDUCED ANISOTROPY

[75] Inventors: Melvyn E. Cowher, Sturbridge, Mass.; Thomas O. Sedgwick, Mohegan Lake, N.Y.

[73] Assignee: International Business Machines Corporation, Armonk, N.Y.

[21] Appl. No.: 947,388

[22] Filed: Sep. 29, 1978

Related U.S. Application Data

[63] Continuation of Ser. No. 824,689, Aug. 15, 1977, abandoned.

[51] Int. Cl.² ............................................. H01F 10/02
[52] U.S. Cl. .................................... 427/128; 428/900
[58] Field of Search .............................. 427/127–132, 427/48; 428/900

[56] References Cited

FOREIGN PATENT DOCUMENTS 1,448,848 9/1976 United Kingdom.

PUBLICATIONS

Besser et al., "Film . . . Garnet Films", pp. 125–129.
Cowher et al., "Epitaxial . . . Vapor Deposition", pp. 621–631, 11–73.

Sadagopan et al., IBM Tech. Dis. Bull., pp. 439–440, vol. 15, No. 2, 7–72.

Primary Examiner—Bernard D. Pianalto
Attorney, Agent, or Firm—Jackson E. Stanland

[57] ABSTRACT

A chemical vapor deposition (CVD) process is described for depositing magnetic oxides, such as garnets, having growth induced anisotropy sufficient to support stable bubble domains, even in very thin films. Organometallic source compounds are used together with low growth temperatures less than 900° C. and high nozzle velocities in the range of 200–600 cm/sec. at room temperature. The oxidant gas mixture contains about 30–50 mol percent $O_2$, rather than approximately 100 mol percent $O_2$, as is usually used in CVD processes for depositing magnetic garnet films. The gas flow is transverse to the plane of the substrate onto which deposition is to occur, and is preferably perpendicular to the plane of the substrate. The individual source compounds are volatilized and carried by an inert gas, combined, then pre-mixed with oxygen in a nozzle without reaction at about 200°–300° C. The gas mixture is then passed at high velocity (200–600 cm/sec) onto a heated substrate. A novel nozzle-substrate arrangement is used which produces a favorable flow pattern and allows the source gas to be mixed with oxygen just immediately before it strikes the hot substrate. This yields optimum thickness and composition control for the particular substrate geometry used.

17 Claims, 1 Drawing Figure

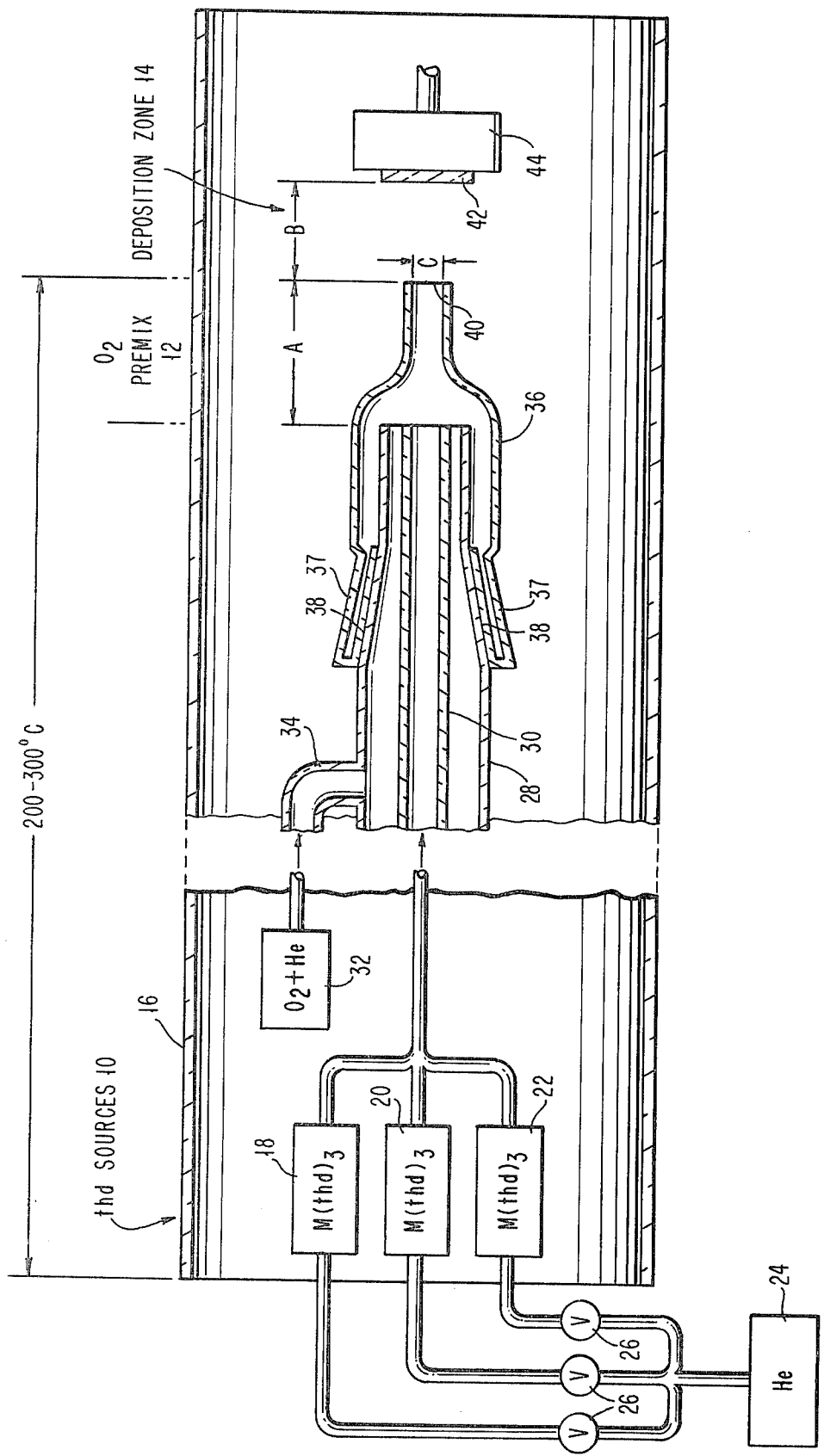

CVD GROWTH OF MAGNETIC OXIDE FILMS HAVING GROWTH INDUCED ANISOTROPY

This is a continuation of application Ser. No. 824,689 filed Aug. 15, 1977 and now abandoned.

BACKGROUND OF THE INVENTION

1. Field of the Invention

This invention relates to a CVD process for producing magnetic oxide films having sufficient growth induced anisotropy to support stable magnetic bubble domains therein, and an apparatus for achieving such films.

2. Description of the Prior Art

Chemical vapor deposition (CVD) has been a preferred technique for large scale manufacturing of single crystal films such as silicon and III-V compounds. These semiconductor crystals have been utilized in devices such as transistors and light emitting diodes. In addition to these uses, CVD has been used to produce magnetic films suitable for supporting stable magnetic bubble domains. In fact, magnetic garnet films were first prepared using CVD.

These CVD films had sufficient stress induced anisotropy to be able to support magnetic bubble domains. Typically, they were epitaxial magnetic garnet films grown on non-magnetic garnet substrates where the uniaxial anisotropy required for bubble domain formation was stress-induced. This stress results from the film/substrate lattice constant mismatch, as well as from thermal expansion mismatch resulting from a difference in thermal expansion coefficients of the film and the substrate.

The following references describe several CVD processes using different source materials to provide the gaseous constituents which are deposited on suitable substrates. Typically, they describe CVD processes for producing magnetic garnet films on non-magnetic garnet substrates. These references are:

1. United Kingdom patent No. 1,392,415
2. U.S. Pat. No. 3,429,740
3. U.S. Pat. No. 3,131,082
4. Besser et al, Mat.Res.Bull. Vol. 6, pp. 1111–1124, 1971
5. Sadagopan and Taylor, IBM Technical Disclosure Bulletin, Vol. 15, No. 2, July 1972
6. Cowher et al, Journal of Electronic Materials, Vol. 3, No. 3, page 621 (1974)

The CVD processes described in these references are all directed to producing anisotropy in magnetic bubble films by a stress mechanism. This is true regardless of whether the source materials are chlorides or organo-metallic compounds such as metal acetyl acetonates. Further, with the exception of the IBM Technical Disclosure Bulletin reference, the substrate temperature is high, generally in excess of 1000° C. Still further, the oxygen stream which reacts with the gaseous source compounds is approximately 100% oxygen in these prior art references. None of these references describes or suggests a process for producing magnetic oxide films where growth induced anisotropy of sufficient magnitude is present to support stable magnetic domains, and in particular very small (i.e., less than 2 microns in diameter) stable magnetic bubble domains.

In the practice of the present invention, it has been recognized that CVD processes were not particularly suitable for the production of magnetic bubble domain films since the high temperatures used in these processes led to a number of difficulties including source degradation and reactor devitrification. These difficulties severely limit the manufacturing potential of CVD processes when magnetic bubble domain films are to be produced. As a consequence, liquid phase epitaxial growth of magnetic bubble domain films has superseded CVD for the growth of magnetic bubble garnet films.

For the production of magnetic bubble domains of very small diameters, large amounts of anisotropy are required. When a stress mechanism is used to produce this anisotropy, greater stresses are required to make films which support very small bubble domains. However, these large stresses can lead to cracking or wrinkling of the bubble films. For these reasons, CVD has been largely abandoned as a technique for producing magnetic bubble domain films.

The present invention seeks to eliminate the problems associated with prior art CVD processes so that CVD will once again become useful for the fabrication of suitable magnetic bubble films. To this end, the present invention seeks to provide a technique for using CVD processes in which the source of the necessary magnetic anisotropy is no longer a stress mechanism. Achievement of anisotropy in CVD bubble films without the need for stresses means that films can be grown to support very small stable bubble domains without undesirable mechanical properties, such as cracking or wrinkling of the bubble domain films.

In the course of numerous experiments, it has been found that certain steps can be undertaken to produce single crystal magnetic oxide films which will have sufficient perpendicular uniaxial anisotropy originating through a growth induced mechanism for support of stable magnetic bubble domains. The steps required in this process are critical and have to be followed in order to provide a sufficient amount of growth induced anisotropy. Additionally, these steps are important to produce smooth bubble films having uniform thickness and uniform magnetic properties throughout the film. Thus, the present invention in its broadest sense concerns a technique for providing, for the first time, chemical vapor deposition of magnetic films having growth induced anisotropy of an amount sufficient to support stable magnetic bubble domains therein.

Accordingly, it is a primary object of the present invention to provide a CVD process for producing magnetic films exhibiting growth induced magnetic uniaxial anisotropy of sufficient magnitude to support stable magnetic bubble domains therein.

It is another object of the present invention to provide a technique for CVD production of magnetic bubble domain films which are smooth and of uniform thickness, and exhibit growth induced magnetic anisotropy.

It is still another object of the present invention to provide magnetic bubble domain films having growth induced anisotropy by a CVD process where the growth rates are sufficiently low to allow very thin magnetic films to be deposited.

It is another object of the present invention to provide chemical vapor deposition of magnetic bubble domain films which support stable micron and submicron size bubble domains by a growth induced anisotropy mechanism.

It is another object of the present invention to provide chemical vapor deposited garnet films for supporting magnetic bubble domains therein, where the primary mechanism for producing anisotropy in these films is growth-induced.

It is another object of this invention to provide magnetic oxide films by chemical vapor deposition where the films exhibit growth induced anisotropy of sufficient magnitude to support stable magnetic bubble domains therein.

BRIEF SUMMARY OF THE INVENTION

The CVD process of the present invention uses organometallic sources, low temperature deposition, high flow velocities, and oxygen concentration which is significantly reduced from that in the prior art. The source input rate of organometallic compounds is carefully controlled to be less than that previously reported by Cowher et al (reference 6) and is achieved by reducing the input concentrations from that reported in this Cowher et al reference. The gas flow is transverse to the plane of the substrate onto which deposition is to occur, and is preferably perpendicular to the plane of the substrate.

In more detail, source materials tris2,2,6,6,tetramethyl3,5heptanedionate complexes, (thd or $M(thd)_3$), are used for deposition of garnet films. Individual source compounds, M(thd's), are volatilized and carried by an inert carrier (such as He), combined, and then premixed with oxygen in a nozzle without reaction at approximately 200°–300° C. This gas mixture is then passed at high velocity onto a transverse r.f. heated substrate. The nozzle arrangement provides a favorable flow pattern and the source gas can be mixed with oxygen just before it strikes the hot substrate. The oxygen concentration is 30–50 mol percent (as opposed to approximately 100% in the prior art) and substrate temperatures are less than 900° C. (typically about 700°–900° C.). The nozzle velocities of the source gases are hundreds of cm/sec and typically are 200–600 cms/sec at room temperature. The input concentrations are typically $3 \times 10^{-5}$–$3 \times 10^{-4}$ mol percent $M(thd)_3$, approximately 70–50 mol percent He, and 30–50 mol percent $O_2$. The oxygen flow determines the final nozzle velocity which is chosen to be approximately 200–600 cm/sec. Typical growth rates are in the range of about 1–3 µm/hour.

The nozzle used in the CVD apparatus consists of two concentric quartz tubes over which a removable quartz extension tube is placed to maintain the proper gas flow pattern in the space between the nozzle exit and substrate. This arrangement produces a favorable flow pattern. Additionally, the inner quartz tube allows the source gas to be mixed with the oxygen (which enters in the outer tube at a later point), and just immediately before it strikes the hot substrate. The length and diameter of the removable extension tube is adjusted to yield optimum thickness and composition control for the particular substrate geometry used. The substrate is positioned vertically and held in place by a small quartz spring.

These and other objects, features and advantages of the present invention will be more apparent from the following more particular description of the preferred embodiments.

BRIEF DESCRIPTION OF THE DRAWING

The FIGURE schematically shows the apparatus used in the present CVD process, and in particular shows the detachable extension tube and nozzle which provides for an advantageous flow pattern.

DETAILED DESCRIPTION OF THE PREFERRED EMBODIMENTS

The drawing schematically illustrates the CVD apparatus used to provide single crystal magnetic oxide films having growth induced anisotropy. The apparatus is basically comprised of three sections which are (1) thd sources 10, (2) $O_2$ premix section 12, and (3) deposition zone 14. An open quartz tube 16 surrounds each of the different sections 10, 12, and 14.

Section 10 provides the volatilized organometallic compounds which are combined with $O_2$ and then carried to the heated substrate for deposition thereon. In more detail, the individual source compounds $M(thd)_3$ are located in quartz source tubes, such as 18, 20, and 22. The nature of these organometallic source compounds will be described in more detail in the following section relating to the general CVD process of the present invention. Typically, these source compounds are organometallic complexes where M represents a rare earth element, transition element, or group IIIA, IV, or VA elements. Each source tube 18, 20, and 22 is connected to a source 24 of inert carrier gas, such as He. Flow meters 26 are located in the lines joining the source tubes 18, 20, and 22 to the inert carrier gas source 24. The individual source tubes are located within the open outer tube 16.

The rest of section 10 is comprised of two concentric tubes 28 and 30, which are typically comprised of quartz. Outer tube 28 is connected to a source 32 of oxygen and an inert gas, such as helium. As will be pointed out more fully later, a basic difference between the present CVD process and CVD processes of the prior art is that source 32 provides a gas stream comprising approximately 30–50% $O_2$, in contrast with prior processes where approximately 100% $O_2$ was provided. The gas stream from source 32 enters outer quartz tube 28 through the input tube 34.

Inner quartz tube 30 is connected to the source tubes 18, 20 and 22, so that volatilized organometallic compounds and an inert carrier gas (He) flow through inner tube 30.

Connected to outer tube 28 is a detachable extension tube 36, which is also made of quartz. Extension tube 36 has ground glass portions 37 which are press fit onto the tapered portion 38 of outer tube 28 to provide a tight fit. Extension tube 36 includes the $O_2$ premix section 12 and a nozzle, generally designated 40. Outer tube 28 and inner tube 30 terminate within extension tube 36, and the section of tube 36 between their termination and the nozzle 40 is the oxygen premix section 12.

One reason for the improved quality of films grown by the present process relates to the features of the detachable extension tube 36. This tube design enables the growth of films with increased growth rate, improved thickness uniformity, and composition control of the films. Tube 36 maintains the proper gas flow pattern in the space between the nozzle exit 40 and the substrate 42. Although some reactions may take place in section 12 and in the deposition zone before the substrate is reached, the present invention limits these reactions. Generally, the formation of solid particles is prevented in region 12 and in the area away from the vicinity of the substrate.

Extension tube 36 allows the source gases (organometallics) to be mixed with oxygen at a point downstream and just immediately prior to the heated substrate 42. That is, the $O_2$ premix section 12 is close to the substrate 42 and at a controllable distance with respect to the substrate. The length and diameter of removable tube 36 can be adjusted to yield optimum thickness and composition control for the particular substrate geometry that is used. Thus, the dimensions A (the length of the O₂ premix section), B (the distance between the nozzle opening and the substrate), and C (the nozzle diameter) can be varied in accordance with design considerations. Representative dimensions will be presented with respect to particular examples.

The substrate 42 is positioned vertically and held in place by a small quartz spring (not shown). An r.f. heated susceptor 44 is used to hold the substrate and to heat the substrate to the proper temperature for deposition thereon. Typically, for the deposition of magnetic garnet films having growth induced anisotropy, the thd source section 10 and the O₂ premix section 12 are maintained at approximately 200°–300° C., while the substrate is heated to a temperature of approximately 700° C. to approximately 900° C. For most garnet films of interest, the deposition temperature is below 900° C., such as 800° C. This, together with the 30–50 mol % O₂, is important for deposition of films having growth induced anisotropy.

In addition to the advantages described above with respect to the use of the detachable extension tube 36, this tube has a nozzle design which produces a marked change in stoichiometry control. The nozzle eliminates the appearance of a second phase in the deposited films and improves the surface smoothness of the films. Consequently, it is easier to observe submicron magnetic domains in the films and to produce films of device quality.

As will be seen, the films of this invention are produced with low oxygen concentrations (30–50 mol percent) and low temperatures (700°–900° C.). The nozzle velocity is about 200–600 cm/sec. The source input rate of organometallic compounds is 3 times less than that reported by Cowher et al in the aforementioned reference 6, since the input concentrations were decreased to be in the $10^{-4}$ mol percent range. Deposition rates of approximately 1–3 microns/hour were obtained. This deposition rate is attributable to the details of the hydrodynamic gas flow and reaction rate which are not obvious at this time, and appear to be due to the design of extension tube 36, and to the dimensions A, B, and C. Further, the vertical placement of the substrate is very important in the provision of good films.

GENERAL CVD PROCESS

The deposition apparatus having now been explained, attention will be turned to the general CVD process of the present invention and then to the effects of each parameter in the process.

In the deposition of magnetic oxide films exhibiting growth induced anisotropy by chemical vapor deposition, magnetic garnet films were deposited on non-magnetic garnet substrates using organometallic compounds. These stable compounds are β-diketone complexes, and specifically the tris2,2,6,6,tetramethyl3,-5heptanedionate complexes, (thd or M(thd)₃) source compounds. These compounds are thermally stable to 300° C., non-hygroscopic, and exist for a very wide range of metals including the rare earth and transition metals. These complexes are reasonably volatile. Significant advantage results when they are used in contrast to inorganic halide sources. The reactivities of both the rare earth and iron thd compounds are sufficiently similar that, with an appropriate input rate, it is possible to obtain only one compound in the deposition zone. Of course, this provides uniform composition in the magnetic films grown by this process.

The structure of the thd complex is as follows:

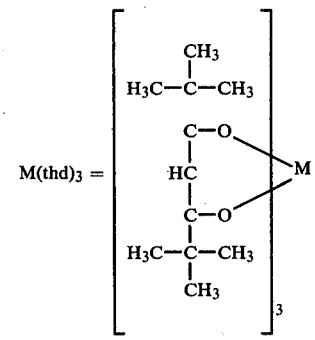

Here, the organometallic complex M(thd)₃ includes the element M, which is a rare earth element, transition element, or a group IIA, IV, or VA element.

The source tubes 18, 20 and 22 are loaded with a charge of powdered material prior to deposition. For a representative garnet composition such as (EuY)₃Fe₅O₁₂ garnet film, the thd compounds would be Fe(thd)₃, Eu(thd)₃, and Y(thd)₃. Of course, for more complex garnet films, other thd compounds would be provided. Any number of elements can be used in the dodecahedral lattice sites of the garnet, and substitutions can be made for Fe in both the octahedral and tetrahedral lattice sites of the garnet.

An inert gas, such as helium from source 24, is passed through each of the source tubes 18, 20 and 22, which join together and lead to the detachable extension tube 36. Helium carrier gas enters the individual source tubes, which are located in either one of two temperature zones along the axis of the reactor and in turn are heated by conventional Variac controlled heating tapes (not shown) wound around the outside reactor tube 16. The individual M(thd)₃ compounds are volatilized and carried by the helium carrier, combined, and then premixed without reaction at 200°–300° C. with 30–50 mol percent O₂ in the premix section 12. The gas stream is then passed at high velocity (200–600 cm/sec) onto a r.f. heated substrate 42. In the practice of this invention, a vertical substrate was found to be necessary for good film thickness uniformity. At the beginning of a deposition run, the substrate can be protected by inserting a quartz shield between the nozzle exit 40 and the substrate 42 until the reactor conditions are stabilized, at which time the quartz shield is removed.

PROCESS PARAMETERS

Low source input rare, improved nozzle design, and lower oxygen concentrations, together with high nozzle velocities, enable the production of garnet films at low temperatures. In turn, these films exhibit a growth induced anisotropy not heretofore possible in CVD produced garnets.

For the growth of magnetic garnet films having sufficient growth induced anisotropy to support stable magnetic bubble domains therein, representative dimensions A, B, and C are the following:

A=4.0 cm
B=~3.0 cm

C=7.0 mm

Typically, the distance B must be in the range 3.0-4.0 cms when A and C are as given, and the substrate is vertically placed. The nozzle optimizes the mixing of oxygen with organometallics without deposition in the nozzle, and provides just the right combination of flow velocity and distance to enable complete reaction to take place and uniform deposition to occur over the substrate area. Larger substrates can be coated using rotation or lateral translation of the substrate.

In general, the dimension B is proportional to the exit velocity V. The higher the exit velocity, the larger is the dimension B. Further, B is proportional to $1/C^2$. As C increases, B decreases because the exit velocity decreases. Based on this, the exit velocity V is proportional to $1/C^2$. Also, the distance A is not so critical, and is chosen to be large enough to allow sufficient mixing of the constituents. As the input source velocity increases, A is increased in order to provide sufficient room for mixing.

The gas flow rate in tubes 28 and 30 determines the nozzle exit velocity, which is equal to the flow rate times the reciprocal of the nozzle area.

The exit velocity of the gas stream from the nozzle 40 is an order of magnitude higher than exit velocities used in the past for production of magnetic garnet films. The exit velocity is typically 200-600 cms/sec, in contrast with other systems where exit velocities 12-15 cms/sec were used. The only previously reported reference using high exit velocities is the aforementioned Cowher et al article in the Journal of Electronic Materials. If the exit velocity is too high, it is difficult to have sufficient quantities of gas exiting from the nozzle using the aforementioned design dimensions, while if the exit velocity is too low, there is a chance that the gas constituents will react before reaching the substrate. Thus, if the exit velocity is either too high or too low, the nozzle would have to be redesigned to change the dimensions A, B and C in order to get the proper flow. Generally, a system using organic sources is not so critical with respect to the location of mixing as is a system where inorganics are used as sources. It is desirable for the $M(thd)_3$ compounds to break up close to the substrate so that substantially all deposition occurs entirely on the substrate.

In the practice of this invention, it is important that the incoming molecules get to the substrate surface sufficiently fast before they have a chance to react. This insures that substantially all reaction will occur at the surface of the substrate, and that no solid particles will be found in the regions of the apparatus having dimensions A and B.

The oxygen is combined with the organometallic compounds in the premix section 12, which is located in advance of the substrate surface. The organometallic compounds are very stable and oxygen, by itself, is not enough to break up these compounds. Oxygen, together with the heat in the close vicinity of the substrate, breaks the ligand off and/or oxidizes it. Thus, as long as the sections 10 and 12 are kept at a low temperature (200°-300° C.), sufficient mixing can occur without reaction and deposition of a garnet film on the surface of the walls of the extension tube 36. This specific nozzle design, together with the flow rates and the dimensions A, B and C, provides enough material having the right composition to go to the substrate for deposition thereon. That is, the gas stream exiting from nozzle 40 has the right composition even though some species oxidize more than others with increasing distance from the nozzle opening. Thus, the dimension A allows sufficient premixing to occur so that the deposited films will have the proper stoichiometry.

A key feature in the present invention is that the oxygen stream from source 32 contains about 30-50 mol percent oxygen, rather than approximately 100 mol percent oxygen. This lower concentration of oxygen slows the reaction down and keeps the reaction between the oxygen and the organometallic compounds from proceeding too fast in advance of the substrate 42. If less than approximately 30 mol percent oxygen is used, the system will be oxygen deficient and the stoichiometry of the garnet films will be oxygen deficient. On the other hand, if the amount of oxygen is greater than approximately 50 mol percent, single crystal growth will occur but sufficient growth induced anisotropy will not be obtained. In general, either an excess or a deficiency of $O_2$ will create a stoichiometry problem when it is desired to obtain magnetic iron garnet films. The stoichiometry should be as perfect as possible in order to insure that growth induced anisotropy will result.

It is also important to use substrate temperatures less than about 900° C. in order to obtain magnetic films with growth induced magnetic anisotropy. In general, for the deposition of garnet films, growth temperatures less than 900° C., and down to about 700° C., are suitable. If the substrate temperature is too low, the organometallic compound cannot be broken up with oxygen in order to oxidize the element M. Thus, the lower limit on substrate temperature is the temperature at which the oxygen flow will not be able to break up the incoming organometallic compound. On the other hand, the upper limit on the temperature (which is about 900° C. is that where the temperature is sufficiently high as to anneal out any growth induced anisotropy. For the deposition of magnetic garnet films suitable for bubble domains, it has been found that temperatures in excess of about 900° C. prevent growth induced magnetic anisotropy of a sufficient magnitude to support stable magnetic bubble domains.

In the practice of this invention, a vertically placed substrate is important in order to obtain films which are uniform in thickness and composition. If the substrate were located in the horizontal plane, bands of deposits with different stoichiometry would result, resulting in non-uniform deposition.

EXAMPLES

Magnetic iron garnet films have been deposited on non-magnetic garnet substrates using this apparatus and process. These films exhibited growth induced uniaxial magnetic anisotropy of a sufficient magnitude to support stable magnetic stripe domains which had very small stripwidths. The lattice constant mismatch was approximately zero and very little stress, if any, resulted from thermal coefficient differences between the substrate and the deposited film. Typically, one micron thick films were grown.

In particular, one micron thick films of $Eu_{1.11}Yb_{1.89}Fe_5O_{12}$ and $Eu_{0.61}Yb_{2.39}Fe_5O_{12}$ were grown on (111) oriented $Gd_3Ga_5O_{12}$. In these films the magnetic anisotropy was due to a growth induced mechanism rather than any stress induced mechanism. The first of these films was deposited at 900° C. and exhibited a lattice constant mismatch $\Delta a$ of 0.015 Angstroms. This lattice mismatch was of the opposite sign needed for stress induced anisotropy. The second mentioned film was deposited at 800° C. and exhibited Δa=0. Magnetic strip domains 0.6–0.8 micron wide and magnetic hysteresis loop analysis indicated perpendicular uniaxial anisotropy. The corresponding growth induced uniaxial anisotropy ($K_u$) of this latter composition was calculated to be approximately $9 \times 10^4$ ergs/cm$^3$.

Substitutions can be made for Fe in the octahedral or tetrahedral lattice sites. This will alter the magnetization of the films in a manner well known in the art. Such substitutional elements include Ga, Si, Al, etc.

In the present process and apparatus, the use of the thd compounds as source materials can be applied to the growth of other single crystal magnetic oxides than those having garnet structures. Qualitatively, the films produced by this process were the same as the best liquid phase epitaxy grown films. The use of the low source input rate, improved nozzle design, and low oxygen concentration enables these films to be deposited at low temperatures, preferably less than 900° C. The proper compositions are achieved at the substrate surface at a temperature sufficiently low that stresses are not introduced so that growth induced anisotropy can dominate. Although the use of these organometallic sources allows low temperature deposition, the proper choice of the amount of oxygen is extremely important, since oxygen percentages above and below the amounts specified do not yield suitable garnet films.

The present process operates at sufficiently low temperatures that good stoichiometry control is maintained in order to reduce lattice mismatch and to minimize thermal mismatches. All of the parameters combine to provide films having growth induced anisotropy, a feature not heretofore found in CVD deposited magnetic films. These films can be used as bubble domain films or as capping layers, etc.

Variations in the process and apparatus will be apparent to those of skill in the art, using the teachings of this application. However, these variations will not depart from the scope and principle of operation of the present invention.

What is claimed is:

1. A CVD process for depositing single crystal magnetic oxide films on substrates, said films exhibiting growth induced magnetic anisotropy, comprising the steps of:
   volatilizing organometallic compounds containing elements of said film to be deposited onto said substrate and passing said volatilized compounds in a gas stream toward said substrate,
   combining said volatilized compounds with a gas stream containing about 30–50 mole percent $O_2$ to produce a mixture of gaseous $O_2$ and said volatilized compounds, said combining occurring at a temperature sufficiently low that said $O_2$ does not break up said organometallic compound during said mixing,
   blowing said mixed gases to said substrate, said substrate being in a plane which is transverse to the direction of movement of said mixed gases and being heated to a temperature at which said $O_2$ breaks up said organometallic compounds to free said elements for reaction with $O_2$ and deposition onto said substrate to produce said film having sufficient growth induced anisotropy to support stable magnetic domains therein, said substrate temperature being less than that which would substantially anneal out said growth induced anisotropy to reduce said anisotropy to a level which is insufficient to support stable bubble domains therein.

2. The method of claim 1, where said film has a garnet structure and said substrate temperature is less than 900° C.

3. The method of claim 1, where said organometallic compounds are (thd) compounds.

4. The method of claim 3, where said gas mixture is blown onto said substrate from a nozzle where the nozzle velocity is in the range of about 200–600 cms/sec.

5. The method of claim 1, where said combining occurs at a location sufficiently close to said substrate that said $O_2$ doesn't have sufficient time to react with said volatilized organometallic compounds to break up said compounds prior to said mixture reaching the vicinity of said substrate.

6. The method of claim 1, where said substrate is substantially perpendicular to said direction of flow.

7. The method of claim 1, where said organometallic compounds are volatilized by passage of an inert gas stream thereacross.

8. The method of claim 1, where said film is a magnetic film less than two microns thick having a garnet structure and said substrate has a garnet structure.

9. A process for chemical vapor deposition of a magnetic garnet film onto a substrate, comprising the steps of:
   volatilizing organometallic compounds containing the elements to be present in said garnet film by passing an inert gas thereacross,
   blowing said volatilized organometallic compounds toward said substrate to an area where $O_2$ is present.
   mixing said volatilized organometallic compounds with $O_2$ in said area at a temperature less than that which would cause said $O_2$ to chemically break up said organometallic compounds to substantially prevent the formation of solid particles in said area, said $O_2$ being brought to said area in a gas stream containing about 30–50 mol percent $O_2$, and
   blowing said mixture of $O_2$ and volatilized organometallic compounds to a heated substrate lying in a plane substantially perpendicular to the direction of movement of said mixture, the temperature of said substrate being at least as high as that which causes $O_2$ to chemically break up said organometallic compounds but not in excess of about 900° C., to deposit said garnet film onto said substrate to a thickness not in excess of about 2 microns, where said film has a stoichiometry such that there is substantial lattice constant matching between said film and said substrate and said film exhibits sufficient growth induced uniaxial magnetic anisotropy to support stable magnetic bubble domains therein.

10. The method of claim 9, where said organometallic compounds are (thd) compounds.

11. The method of claim 10, where said $O_2$ is provided in a gas stream containing about 30–50 mole percent $O_2$.

12. The method of claim 11, where said gas stream includes an inert gas.

13. The method of claim 11, where said $O_2$ and said volatilized organometallic compounds are mixed at a temperature of about 200°–300° C.

14. The method of claim 13, where said substrate temperature is in the range of about 700°–900° C.

15. The method of claim 14, where said garnet film includes at least one element selected from the group consisting essentially of rare earth elements and Y.

16. The method of claim 14, where said mixture of $O_2$ and volatilized organometallic compounds impinges upon said substrate with a velocity in the range of about 200–600 cms/sec.

17. The method of claim 9, where said mixture of $O_2$ and volatized organometallic compounds impinges onto said substrate with a velocity in the range of about 200–600 cms/sec.

* * * * *

UNITED STATES PATENT AND TRADEMARK OFFICE
CERTIFICATE OF CORRECTION

PATENT NO. : 4,211,803
DATED : July 8, 1980
INVENTOR(S) : Melvyn E. Cowher and Thomas O. Sedgwick It is certified that error appears in the above-identified patent and that said Letters Patent are hereby corrected as shown below:

Column 1, line 41, "1,392,415" should read --1,392,514--.

Column 6, line 23, "IIA" should read --IIIA--.

Signed and Sealed this

Ninth Day of December 1980

[SEAL]

Attest:

SIDNEY A. DIAMOND

*Attesting Officer*     *Commissioner of Patents and Trademarks*